United States Patent
Velthuis et al.

(10) Patent No.: US 11,070,036 B2
(45) Date of Patent: Jul. 20, 2021

(54) MULTL-PHASE LAYERED BUSBAR FOR CONDUCTING ELECTRIC ENERGY WHEREIN THE LAYERS ARE GLUED TOGETHER, METHOD OF MANUFACTORING THE SAME AND SWITCHBOARD CABINET INCLUDING SUCH A BUSBAR

(71) Applicant: ABB SCHWEIZ AG, Baden (CH)

(72) Inventors: Rudi Velthuis, Lauchringen (DE); Andrej Krivda, Wettingen (CH); Jens Rocks, Freienbach (CH)

(73) Assignee: ABB SCHWEIZ AG, Baden (CH)

(*) Notice: Subject to any disclaimer, the term of this patent is extended or adjusted under 35 U.S.C. 154(b) by 0 days.

(21) Appl. No.: 16/443,920

(22) Filed: Jun. 18, 2019

(65) Prior Publication Data

US 2019/0305526 A1 Oct. 3, 2019

Related U.S. Application Data

(63) Continuation of application No. PCT/EP2017/083059, filed on Dec. 15, 2017.

(30) Foreign Application Priority Data

Dec. 19, 2016 (EP) .................................... 16205013
Dec. 19, 2016 (EP) .................................... 16205020
Dec. 19, 2016 (EP) .................................... 16205023

(51) Int. Cl.
*H02B 1/21* (2006.01)
*B32B 15/08* (2006.01)
(Continued)

(52) U.S. Cl.
CPC ............... *H02B 1/21* (2013.01); *B32B 15/08* (2013.01); *B32B 15/20* (2013.01); *H01B 7/009* (2013.01);
(Continued)

(58) Field of Classification Search
CPC combination set(s) only.
See application file for complete search history.

(56) References Cited

U.S. PATENT DOCUMENTS 3,264,403 A * 8/1966 Erdle ..................... H02G 5/005
174/72 B
3,400,303 A 9/1968 Rowlands et al.
(Continued)

FOREIGN PATENT DOCUMENTS

DE 102005015945 A1 10/2006
DE 202015104023 U1 11/2016
(Continued)

*Primary Examiner* — William H. Mayo, III
*Assistant Examiner* — Krystal Robinson
(74) *Attorney, Agent, or Firm* — Leydig, Voit & Mayer, Ltd.

(57) ABSTRACT

A multi-phase busbar for conducting electric energy includes: a base layer of an insulating material; a first conducting layer of a sheet metal; a first insulating layer of an insulating material arranged on the first conducting layer; a second conducting layer of a sheet metal arranged on the insulating layer; and a second layer of an electrically insulating material which is arranged on the second conducting layer. The first and/or second insulating layers include spacers, each spacer including a layer of a rigid insulating material. At least one of the spacers is glued to an electrically insulating coating of the first and/or second conducting layer, and/or at least one of the spacers is glued to an electrically conductive surface of an uncoated first and/or second conducting layer by an adhesive.

2 Claims, 2 Drawing Sheets

(51) Int. Cl.
*B32B 15/20* (2006.01)
*H01B 7/00* (2006.01)
*H01B 7/02* (2006.01)
*H01B 7/08* (2006.01)
*H01B 13/06* (2006.01)
*H01R 9/26* (2006.01)
*H02B 1/20* (2006.01)
*H05K 3/20* (2006.01)
*H05K 1/02* (2006.01)
*H02G 5/00* (2006.01)
*H02B 1/056* (2006.01)
*H05K 3/46* (2006.01)

(52) U.S. Cl.
CPC ......... *H01B 7/0216* (2013.01); *H01B 7/0225* (2013.01); *H01B 7/08* (2013.01); *H01B 13/06* (2013.01); *H01R 9/2675* (2013.01); *H02B 1/20* (2013.01); *H02G 5/005* (2013.01); *H05K 1/0256* (2013.01); *H05K 3/202* (2013.01); *B32B 2255/26* (2013.01); *B32B 2457/00* (2013.01); *H02B 1/056* (2013.01); *H05K 3/4641* (2013.01); *H05K 3/4647* (2013.01); *H05K 2201/0187* (2013.01); *H05K 2201/0191* (2013.01); *H05K 2201/10272* (2013.01)

(56) References Cited

U.S. PATENT DOCUMENTS

| | | | |
|---|---|---|---|
| 3,663,866 A | | 5/1972 | Iosue et al. |
| 4,382,156 A | * | 5/1983 | Jodoin .................. H02G 5/005 |
| | | | 174/72 B |
| 5,055,059 A | * | 10/1991 | Logstrup ................. H02B 1/21 |
| | | | 439/214 |
| 6,674,006 B1 | * | 1/2004 | Linehan ............... H01R 31/085 |
| | | | 174/149 B |
| 2004/0069527 A1 | | 4/2004 | Vanhoutte et al. |
| 2017/0201080 A1 | * | 7/2017 | Maurer .................. H02G 5/007 |
| 2020/0389005 A1 | * | 12/2020 | Koizumi ............. B60R 16/0215 |

FOREIGN PATENT DOCUMENTS

| | | |
|---|---|---|
| EP | 1102351 A1 | 5/2001 |
| WO | WO 2017021311 A1 | 2/2017 |

* cited by examiner

MULTI-PHASE LAYERED BUSBAR FOR CONDUCTING ELECTRIC ENERGY WHEREIN THE LAYERS ARE GLUED TOGETHER, METHOD OF MANUFACTORING THE SAME AND SWITCHBOARD CABINET INCLUDING SUCH A BUSBAR

CROSS-REFERENCE TO PRIOR APPLICATION

This application is a continuation of International Patent Application No. PCT/EP2017/083059, filed on Dec. 15, 2017, which claims priority to European Patent Applications EP 16205013.2, filed on Dec. 19, 2016, EP 16205020.7, filed on Dec. 19, 2016, and EP 16205023.1, filed on Dec. 19, 2016. The entire disclosure of the foregoing applications is hereby incorporated by reference herein.

FIELD

The invention is related to a multi-phase busbar, a method of manufacturing the same and a switch board cabinet including such a busbar.

BACKGROUND

The multi-phase busbars are used in switchboards to conduct and distribute alternating electrical current to different electrical devices which are usually installed in switch board cabinets. In order to provide for the possibility to conduct all three phases or even more phases of an alternating current in a single busbar, multi-phase busbars have been developed which comprise a base layer and a cover layer of electrically insulating material between which two or more layers of conducting sheet metal, in particular copper, are arranged that are electrically insulated from each other by means of one or more insulating intermediate layers.

An afore-described busbar in which the different layers are laminated to each other by means of liquid resin is described in DE 10 2005 015 945 B4 of the applicant. The laminated busbar has the advantage that it is compact and does not tend to delaminate due to repellant forces which are generated by the alternating electric currents that are conducted in the different conducting layers of each phase and which in case of a short circuit can be in the range of several thousand amperes (kA).

One problem of the busbars as described in DE 10 2005 015 945 B4 are the costs involved in the lamination process itself in which the different layers are bonded to each other by means of a liquid resin, like epoxy resin, which is applied to the upper and lower side of each layer and cured afterwards. Although laminating resins used for bonding the layers to each other provide for high bonding forces between the layers, the laminating process itself usually produces toxic vapors. Moreover, a direct contact with the resins might cause allergic reactions and thus requires specific safety precautions for the staff involved in the production process.

From non-published EP Application No. 16205023.1 of the applicant it is known to reduce the amount of toxic vapors and the production costs for manufacturing busbars by mechanically attaching the different layers of a busbar to each other by a thermosetting resin which is filled into intercommunicating cavities which are provided in the different layers without gluing the layers to each other.

Moreover, non-published EP Application No. 16205013.2 of the applicant suggests to arrange different intercommunicating cavities around the copper pins of each conducting layer which are afterwards filled up with liquid resin, in order to bond the copper layers and the intermediate layers to each other.

Although the emission of toxic vapors during the production process of the busbars disclosed in the afore-mentioned non-prepublished documents is significantly reduced and the production costs are lowered, the busbars tend to locally delaminate due to the extremely large magnetic and electrical forces interacting between the layers in case of a short circuit. As applicant has found, one of the reasons for the observed local delamination is the occurrence of voids between the surface of the conducting copper layers of each phase and the neighboring intermediate layers, or voids within the insulating material of the intermediate layers itself.

Another problem which arises with the above-referenced laminated busbars is that the manufacturing process is rather complicated because the lamination of the different layers requires high clamping forces, in order to make sure that the cut out areas around the conducting pins are properly sealed and no liquid resin can leak out in the areas around the pins.

SUMMARY

In an embodiment, the present invention provides a multi-phase busbar for conducting electric energy, comprising: a base layer of an insulating material; a first conducting layer of a sheet metal; a first insulating layer of an insulating material arranged on the first conducting layer; a second conducting layer of a sheet metal arranged on the insulating layer; and a second layer of an electrically insulating material which is arranged on the second conducting layer, wherein the first and/or second insulating layers comprise spacers, each spacer comprising a layer of a rigid insulating material, wherein at least one of the spacers is glued to an electrically insulating coating of the first and/or second conducting layer, and/or wherein at least one of the spacers is glued to an electrically conductive surface of an uncoated first and/or second conducting layer by an adhesive.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
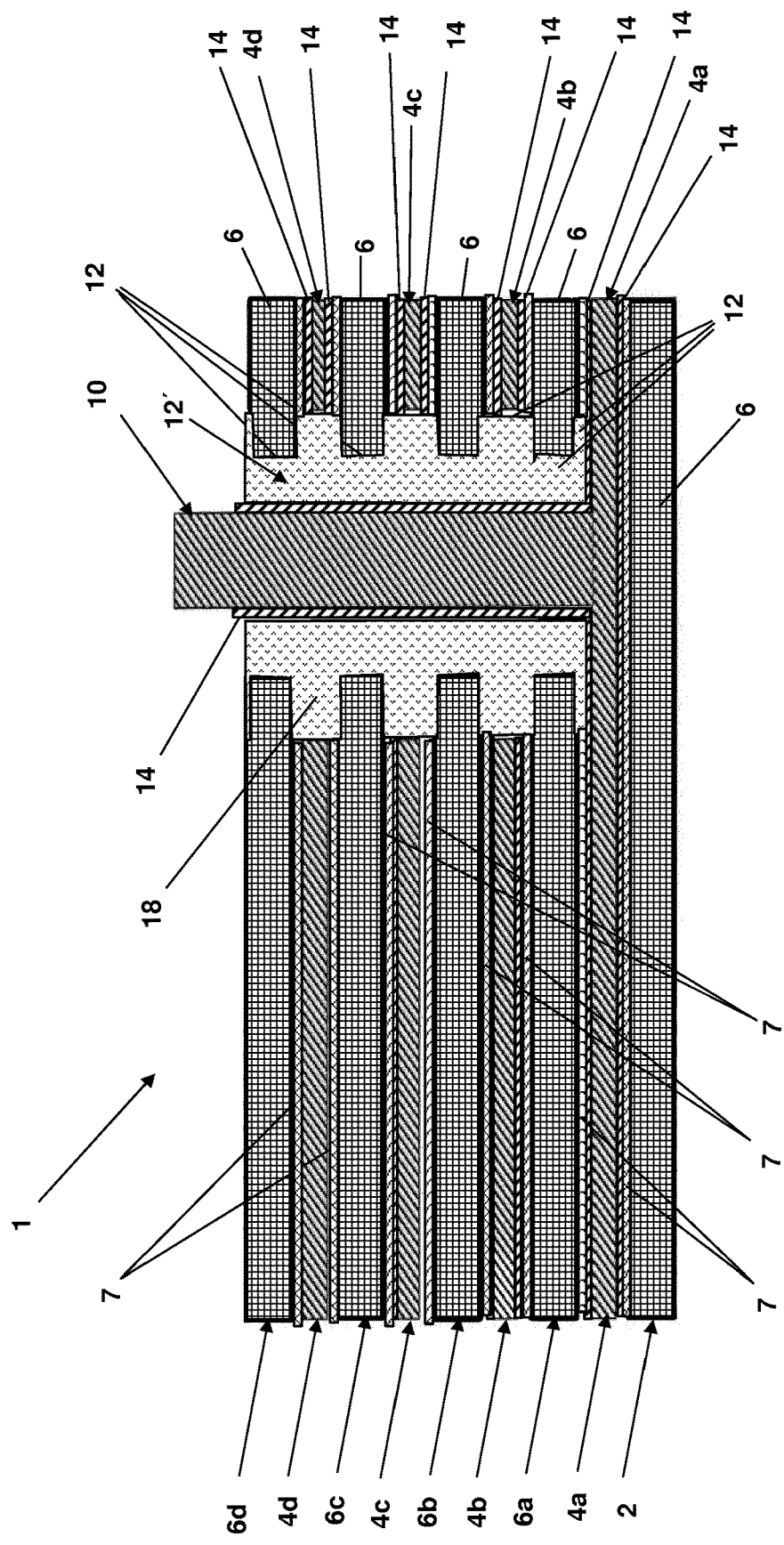
FIG. 1 is a schematic partial side view of a first embodiment of a busbar according to the invention.

In an embodiment, the present invention provides a multi-phase busbar which is easy to manufacture and which shows a reduced tendency of delamination of the different layers in case of an electric short circuiting. Another object of the present invention is to provide for a method of manufacturing such a busbar.

In an embodiment, the present invention provides a switch board cabinet including a multi-phase busbar which can be manufactured at reduced costs and which has an improved resistance against mechanical damages caused by an electric short circuiting.

According to a first object of the invention, a multi-phase busbar comprises an optional base layer of an insulating material, a first conducting layer of a sheet metal, a first insulating layer of an insulating material arranged on said first conducting layer, a second conducting layer of a sheet metal arranged on the insulating layer and a second layer of an electrically insulating material which is arranged on the second conducting layer. In this configuration of two conducting layers, which represents the minimum configuration of a busbar, only two phases of an alternating current can be distributed by the busbar. Accordingly, in order to distribute an electric alternating current having three independent phases and one conducting layer connected to protective earth potential, there are preferably three, four, five or even more conducting layers instead of the mentioned two conducting layers arranged in the busbar that are separated by a respective number of insulating layers. For the sake of simplicity, the gist of the present invention is hereinafter described with reference to a basic configuration of a busbar with regard to the first two essential conducting layers and spacers without limiting the scope of the invention to this embodiment.

In the busbar according to the invention the first and second insulating layers are spacers which include a central layer of a rigid insulating material. The central layer is preferably made of fiber reinforced plastics or SMC material or polyester resin glass mats, like for example GP0-3 or UP GM 203 or HM 2471 and has the shape of an elongated cuboid, to which a first conducting layer of electrically conducting material and a second conducting layer of an electrically conducting material are arranged or firmly mounted at opposing sides thereof. According to the invention, the first central insulating layer and the first and second conducting layers are mechanically and/or chemically bonded to the opposing outer surface areas of said central layer of insulating material. Accordingly, the spacers are prefabricated units which may be obtained from commercially available fiber reinforced plastics sheet material, as it is e.g. used as the base material for printed circuit boards.

According to another embodiment of the invention, at least one conducting layer, in particular the first and/or the second conducting layer, comprise a coating of an electrically insulating material which preferably includes a cured resin, in particular cured epoxy resin. The coating may have a thickness between a fraction of a millimeter and one millimeter or even more, like for example between 0.1 mm and 0.5 mm, and may be applied by dipping the conducting layers into a bath containing the liquid coating material and drying the coating afterwards (dipcoating)), wherein as an alternative embodiment also a thin insulating film can be bonded on the conducting layers or thermal spraying or PVD/CVD processes of electrically insulating material can be performed. By applying an additional insulating coating to the conducting layers, the danger of a short circuiting between two adjacent conducting layers can further be reduced and the reliability of the busbars increased. The insulating coating preferably also covers the surface of the connecting pins (which will be described hereinafter) except for the connecting end portions where the electric voltage is supplied to the connecting pin of the respective conducting layer. In a further embodiment of the invention each conducting layer of a busbar comprise said coating of an electrically insulating material or at least every second conducting layer comprise said coating of an electrically insulating material, as described above, wherein the other conducting layer remain uncoated.

The busbar according to the invention is wherein the spacers are arranged and/or firmly mounted on, in particular glued to, the coating of the electrically insulating material on the at least one coated conducting layer, and/or to the electrically conducting surface of the at least one uncoated conducting layer, in particular on the first and second conducting layer, by means of an adhesive.

In a further embodiment the adhesive is preferably a thermally curable adhesive, like a thermosetting resin, e.g. an epoxy or a PU resin, which after curing remains rigid even when heating up the busbar to a temperature of more than 150° C. or higher. Alternatingly, the adhesive may also be a conventional 2 component laminating resin which cures within a certain period of time, e.g. 5 to 10 minutes or longer, after mixing the two components.

The invention has the advantage that the spacers can be obtained with relatively low effort and in a cost effective way from stock material, which stock material can e.g. be cut into the desired shape by punching, milling, waterjet cutting, lasing or applying/using other appropriate cutting devices, in particular a cutting device for fiber reinforced plastics, and can be handled and machined as independent elements without facing the problems of toxic vapors which have to be eliminated when laminating the different layers to each other by means of a laminating resin. Furthermore, the spacers may have a thickness of one to several millimeters, in particular 1 mm to 5 mm. Anyhow, a laminating process of the central rigid insulating layer of each spacer may be separated from the assembling process of the busbar itself, the total amount of vapors produced during the assembly process of the busbar can be significantly reduced.

According to a first aspect of the invention, the adhesive is applied to the conducting layers, in particular the electrically conducting surface of the uncoated conductive layers, and/or the coating on the conducting layers and/or to the insulating layer and/or surface of a spacer, in particular by a nozzle as a line of adhesive, which may e.g. have a sinusoidal shape and which after curing forms a line-shaped material bridge between the coatings of the first and second conducting layers and the abutting spacer, respectively. This provides for the advantage that due to the comparatively small surface area of the adhesive line, the amount of any toxic vapors emitted therefrom during the assembly of the busbar is further reduced.

Alternatingly, the adhesive may also be applied to the upper side of the conducting layer as a continuous layer which in particular at least partially covers the outer surface area of the coatings applied to at least some of the conducting layers. The layer of adhesive may be applied by spraying the liquid adhesive onto the conducting layer and/or the insulating coating of the conducting layer, or surface of the spacers, or by applying a certain amount of liquid adhesive to the insulating coating layer and/or conducting layer and/or surface of a spacer by means of a furred roller.

According to another aspect of the invention, the electrically conducting material of the first and second conducting layer and also of any further conducting layers employed is a sheet metal, preferably copper or aluminium, which may have a thickness between a fraction of a millimeter and several millimeters, like for example 0.5 mm and 5 mml [Rvl] or even more.

In one embodiment of the invention the multi-phase busbar for conducting electric energy, comprises an optional base layer of an insulating material, a first conducting layer of a sheet metal, a first insulating layer of an insulating material arranged on said first conducting layer, a second conducting layer of a sheet metal arranged on said insulating layer and a second layer of an electrically insulating material which is arranged on said second conducting layer, wherein said first and second conducting layers comprise a coating of an electrically insulating material and said first and second insulating layers are spacers each comprising a layer of a rigid insulating material, wherein said spacers are mounted and/or glued to the coating of said electrically insulating material on said first and second conducting layer by means of an adhesive.

In another embodiment of the invention, the surfaces of the conductive layer and in particular the coatings of at least one of the first and second and preferably also all other conducting layers of a busbar directly abut the first and second surface or surface layer of the neighboring insulating layers (spacers), respectively. This provides for the advantage that the thickness of the busbar can be kept low, as no additional intermediate layers of insulating material are employed.

According to yet a further aspect of the invention, the first conducting layer, the first spacer, the second conducting layer and the second spacer, and preferably also all other conducting layers and spacers of a busbar having more than two conducting layers can additionally be bonded to each other in a form-locking manner by means of a material bridge of rigid cured insulating material. This material bridge may be formed by pouring liquid resin into a common cavity which is provided by intercommunicating openings in the stack of layers of the busbar and hardening the resin, while pressing the layers of the stack together.

The first conducting layer comprises at least one first conducting pin which is mounted thereat. The conducting pin extends in a direction which is preferably perpendicular to the first conducting layer and serves to supply electric energy for a respective phase of the electric current to the first conducting layer of the bus bar. The conducting pin which is also referred to as a connecting pin, extends through a common opening which is formed by communicating openings in each of the first spacers and/or insulating layers and conducting layers of a bus bar having two conducting layers. In a multi-phase busbar having more than two conducting layers and insulating layers, there is at least one conducting pin for each electrical phase connected to a respective conducting layer which extends through all insulating layers spacers and conducting layers that are arranged along the extending conducting pin, in particular above the associated conducting layer.

In order to avoid the danger of sparking and short circuiting between the different conducting layers in the region of the common opening, the communicating opening through which the first conducting pin extends may form a common cavity which is filled up with cured resin after the adhesive has been cured. The cured resin insulates the conducting pin and conducting layers and forms a material bridge which in addition to the cured adhesive mechanically interconnects the first connecting pin with the adjacent layers. This has the advantage that the material bridge provides for an electrical insulation of the layers and the conducting pin as well as for a mechanical connection of the different layers of a stack at the same time.

In a further embodiment the multi-phase busbar composed of conducting layers and insulating materials to electrically insulate said conducting layers from each other is formed like a wall and is flat.

Hereby the busbar can be used as a protection or cover of a cabinet or within a cabinet.

Further advantageously a section or cabinet, comprising a housing, whereas the housing comprises at least a rear side, comprises at least one multi-phase busbar as described above which is arranged on the rear side of the section or cabinet and/or forms at least a part of a back wall of the housing. Hereby is ensured an easy arrangement of modules, especially withdrawable modules or plug-in modules within a section or cabinet. The modules can be plugged on the conducting pins and the multi-phase busbar can be designed as a replacement part. The multi-phase busbar can be designed according to the types and to the number of modules to be used.

In further embodiment, advantageously several multi-phase busbars are arranged on the rear side of the section or cabinet and/or form at least a part of a back wall of the housing, whereas the multi-phase busbars are on top of each other and whereas each multi-phase busbar is formed as a band. Thereby a multi-phase busbar system can be located at the back side of a low voltage switchgear cabinet or section. The multi-phase busbar system can be split in several rows, in particular four rows of horizontal multi-phase busbars of the same size and cross section.

According to yet another aspect of the present invention, a method of manufacturing a multi-phase busbar as described herein before comprises the following method steps:

placing a base layer of an electrically insulating material in a mold, applying a curable adhesive on top of the base layer and/or on the lower side of a first conducting layer and/or on the insulating coating on the lower side of the first conducting layer, arranging the first conducting layer of an electrically conducting material, which in particular is coated with an electrically insulating material, on the base layer, applying a curable adhesive on the upper side of the first conducting layer and in particular to the coating on the upper side of the first conducting layer, arranging a first prefabricated spacer which includes a central layer of a rigid insulating material, applying a curable adhesive to the upper side of the first spacer and/or on the lower side of a second conducting layer and/or on the insulating coating on the lower side of the second conducting layer, arranging a second conducting layer which in particular is coated with an electrically insulating material on the upper side of first spacer, applying a curable adhesive to the upper side of the second conducting layer and in particular to the coating on the upper side of the first conducting layer, arranging a second prefabricated spacer including a central layer of a rigid insulating material above the second conducting layer, and urging/pressing the base layer or first conducting layer and the second prefabricated spacer against each other while curing the adhesive.

In a further embodiment the first two steps are optionally in particular when the first conducting layer is coated, wherein the new first step then comprises placing the first conducting layer of an electrically conducting material, which in particular is coated with an electrically insulating material and the next steps are as described above.

In a further embodiment to build a n-phase busbar the first steps comprise placing a base layer of an electrically insulating material in a mold, applying a curable adhesive on top of the base layer and/or on the lower side of a first conducting layer and/or on the insulating coating on the lower side of the first conducting layer, arranging the first conducting layer of an electrically conducting material, which in particular is coated with an electrically insulating material, on the base layer, applying a curable adhesive on the upper side of the conducting layer and in particular to the coating on the upper side of the conducting layer and/or on the lower side of a spacer, arranging a prefabricated spacer which includes a central layer of a rigid insulating material, wherein the further steps comprise applying a curable adhesive to the upper side of the spacer and/or on the lower side of a further conducting layer and/or on the insulating coating on the lower side of the further conducting layer, arranging the further conducting layer which in particular is coated with an electrically insulating material on the upper side of the spacer, applying a curable adhesive to the upper side of further second conducting layer and in particular to the coating on the upper side of the first conducting layer, arranging a further prefabricated spacer including a central layer of a rigid insulating material on top of the further conducting layer, wherein the further steps may be repeated until the number of n-phases (n-conducting layers) is provided.

A final step then comprises urging/pressing the base layer or first conducting layer and the further and final prefabricated spacer respectively against each other while curing the adhesive.

In a further embodiment of the invention the method comprises steps of placing a base layer of an electrically insulating material in a mold, applying a curable adhesive on top of the base layer and/or on the lower side of a first conducting layer and/or on the insulating coating on the lower side of the first conducting layer, arranging the first conducting layer of an electrically conducting material, which in particular is coated with an electrically insulating material, on the base layer, applying a curable adhesive to the coating on the upper side of the first conducting layer, arranging a first prefabricated spacer which includes a central layer of a rigid insulating material, applying a curable adhesive to the upper side of the first spacer, arranging a second conducting layer which is coated with an electrically insulating material on the upper side of first spacer, applying a curable adhesive to the upper side of the insulating coating on the upper side of the second conducting layer, arranging a second prefabricated spacer including a central layer of a rigid insulating material on top of the second conducting layer, and urging/pressing the base layer or first conductive layer and the second prefabricated spacer against each other while curing the adhesive.

In a further embodiment the first two steps are optionally in particular when the first conducting layer is coated, wherein the new first step then comprises placing the first conducting layer of an electrically conducting material, which in particular is coated with an electrically insulating material and the next steps are as described above.

In a preferred embodiment, the method includes the following further method steps of at least one first connecting pin at said first conducting layer, providing communicating openings in the first, second and further spacers and in the second and further conducting layers through which the first connecting pin extends, and/or providing at least one further common recess in the conducting layers and the spacers, filling up the communicating openings and/or the common recess with a curable liquid resin, and curing the resin.

Pursuant to yet another aspect of the present invention, a multi-phase busbar as described herein before is arranged in a switchboard cabinet for distributing electric energy to a plurality of electric or electronic devices which are contained in the switchboard cabinet.

In this respect, a very cost efficient and compact design of the switchboard cabinet may be obtained when the busbar according to the invention forms a rear panel of the switch board cabinet, or at least a part of the rear panel of the switch board cabinet.

As it is shown in FIG. 1, a multi-phase busbar 1 for conducting electric energy, comprises a base layer 2 made of an electrically insulating material, e.g. a sheet molding compound or a fiber reinforced plastics or polyester resin glass mats, like for example GP0-3 or UP GM 203 or HM 2471. On the base layer 2 there is arranged a first conducting layer 4a which is made of a sheet metal, preferably copper or aluminium, which can have a thickness between a fraction of a millimeter and several millimeters, in particular between 0.5 mm and 5 mm, like for example 0.5 mm, 0.8 mm, 1.5 mm and 5 mm or even more.

On the first conducting layer 4a is arranged a first insulating layer 6a, in particular with a thickness of between 1 mm and 5 mm, and on the first insulating layer 6a is arranged a second conducting layer 4b, on which further insulating layers 6c, 6d and further conducting layers 4c and 4d may alternatingly be disposed.

As it can further be seen from FIG. 1, the first and second conducting layers 4a, 4b and preferably also the further conducting layers 4c to 4d used in a busbar 1 having more than two conducting layers comprise a coating 14 of an electrically insulating material which preferably includes a cured resin, in particular a cured epoxy resin.

According to the invention, at least the first insulating layer 6a and second insulating layer 6b and preferably also the further insulating layers 6c to 6e are configured as insulating spacers, each of which comprises a central layer 6 of a rigid insulating material. The base layer 2 may also be made from the same stock plate material from which the other spacers 6a to 6e are made. The materials (as mentioned above) used to build the spacer provide extremely high and homogenous intrinsic bonding forces over the entire spacer structure and surface area of the central insulating layer 6 which may be considered the reason for the spacers 6a to 6d, when mounted on the conductive layers and/or the coating of the conductive layers by an adhesive and forming or building or generating a stable and/or stiff structure, being able of withstanding the extremely high magnetic and electric delamination forces which are generated in case of a short circuit between the first and the second conducting layers 4a, 4b.

Another advantage of the spacers used in the busbars according to the present invention can be seen in that they form independent units which can be manufactured from stock material, like for example fiber reinforced plastics or SMC material or polyester resin glass mats, like for example GP0-3 or UP GM 203 or HM 2471, and have the shape of an elongated cuboid, that can e.g. afterwards be cut or machined into the desired shape by punching, milling, waterjet cutting, lasing or applying/using other appropriate cutting devices, in particular a cutting device for fiber reinforced plastics.

As it is further shown in FIG. 1, the conducting layers 4a to 4d and the spacers 6a to 6d are connected to each other by an adhesive 7 which is applied as a line onto each uppermost layer of the stack of layers before positioning the next layer on top this layer to become the next top layer. After the last insulating spacer 6d has been arranged as the last top layer on the fourth conducting layer 4d, pressure is applied to the base layer 2 and topmost layer 6d by pressure elements and the adhesive is cured. In case of a thermally curable adhesive, the curing may be achieved by heating up the entire stack of layers 2, 4a to 4d and 6a to 6d in an oven, in order to form the final busbar 1.

As it can further be seen from FIG. 1, the first conducting layer 4a comprises at least one first conducting pin 10, which extends in a direction perpendicular to the plane of the first conducting layer 4a and which is either integrally formed with the conducting layer 4a when manufacturing the same or which is soldered or mechanically attached to the sheet metal by screwing or clamping.

In a further embodiment the respective conducting pin is built as solid or hollow cylinder or like a cup, which pin when mounted is in electrical contact with one conductive layer of the busbar, and/or the conducting pin is detachably and/or mechanically attached to and/or mounted on, in particular by screwing to or clamping, the multiphase bus and in particular at one conductive layer and/or the base layer.

In a further embodiment more than one conducting pin, in particular three or four or five or more pins, are electrically connected to and detachably and/or mechanically connected to one conducting layer and in particular the same conducting layer.

In a further embodiment, the conducting pins may be arranged in line in groups, in particular within a group in vertical or horizontal arrangement, or may be arranged in an array.

In another embodiment the respective conducting pin may comprise further mounting means, like internal screw threads or external screw threads, in particular for the attachment of electrical devices as well as for the attachment to the bus bar.

In the same way, each of the further conducting layers 4b to 4d also comprises a least one similar conducting pin which extends in an associated common opening that is formed in the spacers 6b to 6d and conducting layers 4c and 4d, respectively. In order to reduce the risk of an electric short circuit between two adjacent conducting layers 4a to 4d, which are each connected to a different electrical phase or protective earth (PE) of an electric power source, the openings 12 in the spacers 6a to 6d may have a smaller diameter than the openings 12 in the conducting layers 4a to 4d.

In order to electrically insulate the conducting layers 4a to 4c from each other and from the connecting pin 10 and to provide for an additional mechanical connection between the conducting layers 4a to 4d and the spacers 6a to 6d, a material bridge 18 of rigid insulating material which is received in a common cavity 12' may be formed around the connecting pin 10. The material bridge 18 is preferably formed by liquid resin which is cast into the common cavity 12' and cured while curing the adhesive 7 or afterwards. The cast resin may also include reinforcing fibers, in order to improve the mechanical strength of the material bridge 18.

Although the preferred position for such a common cavity 12' is in the area around a conducting 10 pin it is also conceivable to form the cavity at any other location of the busbar 1.

Figure 2:
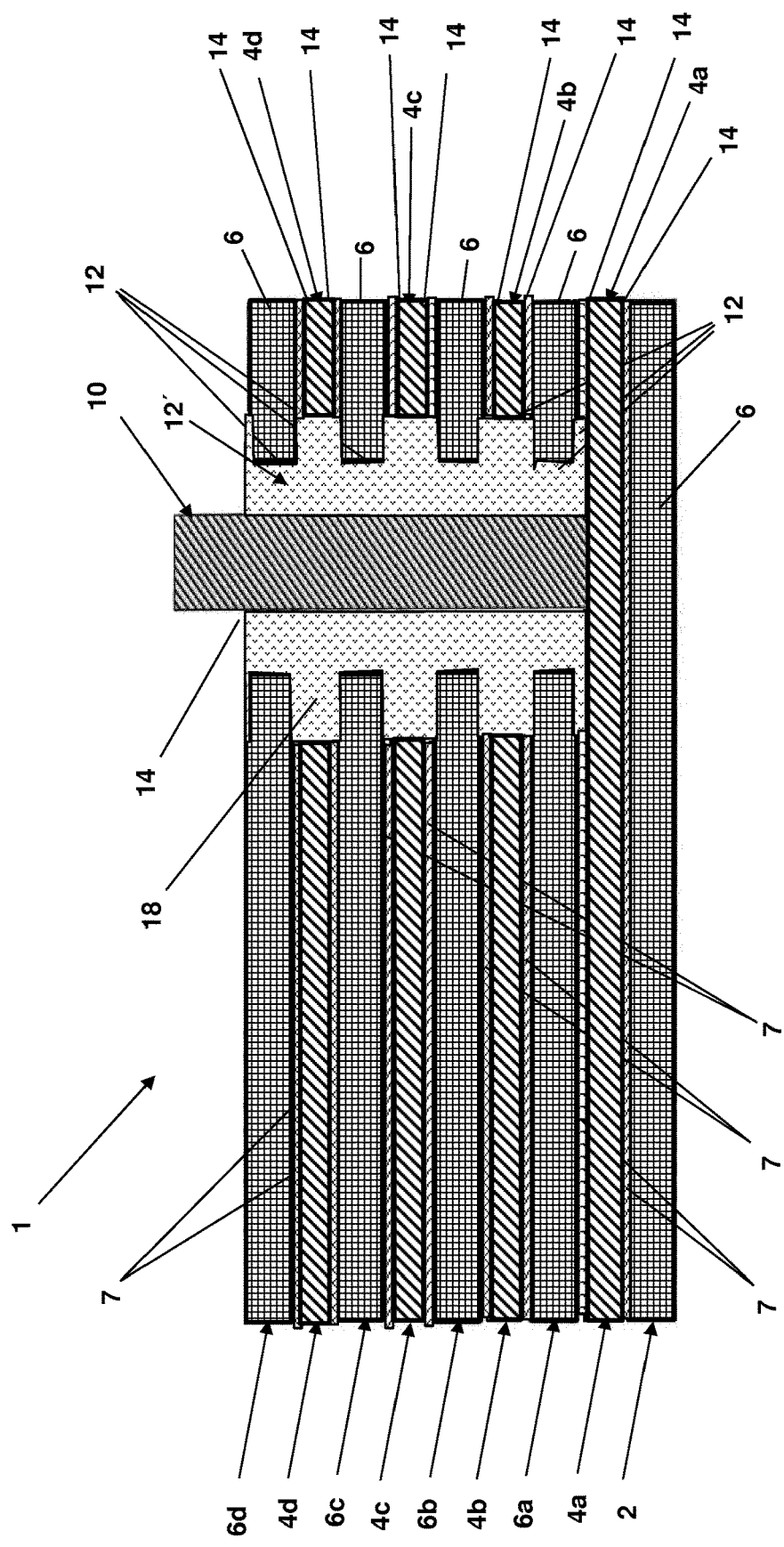
FIG. 2 is a schematic partial side view of a second embodiment of a busbar according to the invention.

As it is shown in FIG. 2, a multi-phase busbar 1 for conducting electric energy, comprises a base layer 2 made of an electrically insulating material, e.g. a sheet molding compound or a fiber reinforced plastics or polyester resin glass mats, like for example GP0-3 or UP GM 203 or HM 2471. On the base layer 2 there is arranged a first conducting layer 4a which is made of a sheet metal, preferably copper, which can have a thickness between a fraction of a millimeter and several millimeters, in particular between 0.5 mm and 5 mm, like for example 0.5 mm, 0.8 mm, 1.5 mm and 5 mm or even more.

On the first conducting layer 4a is arranged a first insulating layer 6a and on the first insulating layer 6a is arranged a second conducting layer 4b, on which further insulating layers 6c, 6d and further conducting layers 4c and 4d may alternatingly be disposed.

As it can further be seen In FIG. 2 in contrast to FIG. 1, the first and second conducting layers 4a, 4b and preferably also the further conducting layers 4c to 4d used in a busbar 1 having more than two conducting layers and/or the conducting pins do not comprise a separate coating.

According to the invention, at least the first insulating layer 6a and second insulating layer 6b and preferably also the further insulating layers 6c to 6e are configured a insulating spacers, each of which comprises a central layer 6 of a rigid insulating material. The base layer 2 may also be made from the same stock plate material from which the other spacers 6a to 6e are made. The materials (as mentioned above) used to build the spacer provide extremely high and homogenous intrinsic bonding forces over the entire spacer structure and surface area of the central insulating layer 6 which may be considered the reason for the spacers 6a to 6d, when mounted on the conductive layers and/or the coating of the conductive layers by an adhesive and forming or building or generating a stable and/or stiff structure, being able of withstanding the extremely high magnetic and electric delamination forces which are generated in case of a short circuit between the first and the second conducting layers 4a, 4b.

Another advantage of the spacers used in the busbars according to the present invention can be seen in that they form independent units which can be manufactured from stock material, like for example fiber reinforced plastics or SMC material or polyester resin glass mats, like for example GP0-3 or UP GM 203 or HM 2471, and have the shape of an elongated cuboid, that can e.g. afterwards be cut or machined into the desired shape by punching, milling, waterjet cutting, lasing or applying/using other appropriate cutting devices, in particular a cutting device for fiber reinforced plastics, The spacers may in particular have a thickness between one and several millimeters, like for example in between 1 mm and 5 mm.

As it is further shown in FIG. 2, the conducting layers 4a to 4d and the spacers 6a to 6d are connected to each other by an adhesive 7 which is applied as a line onto each uppermost layer of the stack of layers before positioning the next layer on to this layer to become the next top layer. After the last insulating spacer 6d has been arranged as the last top layer on the fourth conducting layer 4d, pressure is applied to the base layer 2 and topmost layer 6d by pressure elements and the adhesive is cured. In case of a thermally curable adhesive, the curing may be achieved by heating up the entire stack of layers 2, 4a to 4d and 6a to 6d in an oven, in order to form the final busbar 1.

As it can further be seen from FIG. 2, the first conducting layer 4a comprises at least one first conducting pin 10, which extends in a direction perpendicular to the plane of the first conducting layer 4a and which is either integrally formed with the conducting layer 4a when manufacturing the same or which is soldered or mechanically attached to the sheet metal by screwing or clamping.

In a further embodiment the respective conducting pin is built as solid or hollow cylinder or cup, which cylinder or cup when mounted is in electrical contact with one conductive layer of the busbar, wherein the conducting pin is detachably and/or mechanically attached to and/or mounted on, in particular by screwing to or clamping, the multiphase bus and in particular at one conductive layer and/or the base layer.

In a further embodiment more than one conducting pin, in particular three or four or five or more pins, are electrically connected to and detachably and/or mechanically connected to one conducting layer and in particular the same conducting layer.

In a further embodiment, the conducting pins may be arranged in line in groups, in particular within a group in vertical or horizontal arrangement, or may be arranged in an array.

In another embodiment the respective conducting pin may comprise further mounting means, like internal screw threads or external screw threads, in particular for the attachment of electrical devices as well as for the attachment to the bus bar.

In the same way, each of the further conducting layers 4b to 4d also comprises a least one similar conducting pin which extends in an associated common opening that is formed in the spacers 6b to 6d and conducting layers 4c and 4d, respectively. In order to reduce the risk of an electric short circuit between two adjacent conducting layers 4a to 4d, which are each connected to a different electrical phase or protective earth (PE) of an electric power source, the openings 12 in the spacers 6a to 6d may have a smaller diameter than the openings 12 in the conducting layers 4a to 4d.

In order to electrically insulate the conducting layers 4a to 4c from each other and from the connecting pin 10 and to provide for an additional mechanical connection between the conducting layers 4a to 4d and the spacers 6a to 6d, a material bridge 18 of rigid insulating material which is received in a common cavity 12' may be formed around the connecting pin 10. The material bridge 18 is preferably formed by liquid resin or epoxy cast which is cast into the common cavity 12' and cured while curing the adhesive 7 or afterwards. The cast resin or epoxy may also include reinforcing fibers, in order to improve the mechanical strength of the material bridge 18.

Although the preferred position for such a common cavity 12' is in the area around a conducting 10 pin it is also conceivable to form the cavity at any other location of the busbar 1.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LISTING OF REFERENCE NUMERALS 1 busbar
2 base layer
4a first conducting layer
4b second conducting layer
4c third conducting layer
4d fourth conducting layer
6 central layer of insulating material
6a first insulating layer
6b second insulating layer
6c third insulating layer
6d fourth insulating layer
7 adhesive
10 connecting pin
12 openings in layers
12' common cavity
14 electrically insulating coating
18 material bridge

What is claimed is:

1. A method of manufacturing a multi-phase busbar, the method comprising the following method steps:
   placing a base layer of an electrically insulating material in a mold;
   applying a curable adhesive at least one of on top of the base layer, on a lower side of a first conducting layer, or on the insulating coating on the lower side of the first conducting layer;
   arranging the first conducting layer of an electrically conducting material, which is coated with an electrically insulating material, on the base layer;
   applying a curable adhesive on the upper side of the first conducting layer to the insulating coating on the upper side of the first conducting layer;
   arranging a first prefabricated spacer which includes a central layer of a rigid insulating material;
   applying a curable adhesive at least one of to the upper side of the first spacer, on the lower side of a second conducting layer, or on the insulating coating on the lower side of the second conducting layer;
   arranging a second conducting layer which is coated with an electrically insulating material on the upper side of first spacer;

applying a curable adhesive to the upper side of the second conducting layer and to the insulating coating on the upper side of the first conducting layer; and arranging a second prefabricated spacer including a central layer of a rigid insulating material on top of or above the second conducting layer;

urging/pressing the base layer or first conductive layer and the second prefabricated spacer against each other while curing the adhesive;

providing at least one first connecting pin at the first conducting layer;

providing communicating openings in the first and second spacers and in the second conducting layer through which the first connecting pin extends, or providing at least one further common recess in the conducting layers and the spacers;

filling up the communicating openings or the common recess with a curable liquid resin; and curing the resin while urging the layers against each other.

2. A method of manufacturing a multi-phase busbar, the method comprising the following method steps:

providing a base layer of an electrically insulating material;

applying a curable adhesive on the base layer;

arranging a first conducting layer of an electrically conducting material which is coated with an electrically insulating material on the base layer;

applying a curable adhesive on the insulating coating of the first conducting layer;

arranging a first prefabricated spacer, including a central layer of a rigid insulating material, on the first conducting layer;

applying a curable adhesive on the upper side of the first spacer;

arranging a second conducting layer which is coated with an electrically insulating material on the first spacer;

applying a curable adhesive to the upper side of the insulating coating on the second conducting layer;

arranging a second prefabricated spacer, including a central layer of a rigid insulating material, on top of the second conducting layer;

urging the base layer and the second prefabricated spacer against each other while curing the adhesive;

providing at least one first connecting pin at the first conducting layer;

providing communicating openings in the first and second spacers and in the second conducting layer through which the first connecting pin extends, or providing at least one further common recess in the conducting layers and the spacers;

filling up the communicating openings or the common recess with a curable liquid resin; and curing the resin while urging the layers against each other.

* * * * *